(12) United States Patent
Chiu et al.

(10) Patent No.: US 10,885,981 B2
(45) Date of Patent: Jan. 5, 2021

(54) CONTENT-ADDRESSABLE MEMORY HAVING SIX-TRANSISTOR CONTENT-ADDRESSABLE MEMORY CELLS

(71) Applicant: UNITED MICROELECTRONICS CORP., Hsin-Chu (TW)

(72) Inventors: Zih-Yu Chiu, Hsinchu (TW); Hsin-Wen Chen, Hsinchu County (TW); Yen-Yao Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/254,611

(22) Filed: Jan. 23, 2019

(65) Prior Publication Data
US 2020/0234765 A1   Jul. 23, 2020

(51) Int. Cl.
*G11C 15/04*   (2006.01)
(52) U.S. Cl.
CPC .................. *G11C 15/04* (2013.01)
(58) Field of Classification Search
CPC ....... G11C 15/00; G11C 15/046; G11C 11/41; G11C 11/412; G11C 11/417
USPC .................. 365/49.1, 49.11, 49.17
See application file for complete search history.

(56) References Cited

U.S. PATENT DOCUMENTS

| 6,101,116 | A | * | 8/2000 | Lien | ............ | G11C 15/04 |
| | | | | | | 365/154 |
| 2007/0274124 | A1 | * | 11/2007 | Otsuka | ............ | G11C 11/417 |
| | | | | | | 365/154 |
| 2016/0372180 | A1 | * | 12/2016 | Amara | ............ | G11C 11/419 |

OTHER PUBLICATIONS

Pagiamtzis, "Content-Addressable Memory (CAM) Circuits and Architectures: A Tutorial and Survey". IEEE Journal of Solid-State Circuits, vol. 41, No. 3, Mar. 2006.

* cited by examiner

*Primary Examiner* — Alfredo Bermudez Lozada
(74) *Attorney, Agent, or Firm* — Winston Hsu

(57) ABSTRACT

A cell of a content-addressable memory (CAM) has a first switch, a second switch and a storage unit. A first end of the first switch and a first end of the second switch are coupled to a matchline. The first switch is controlled by a first search signal, and the second switch is controlled by a second search signal. The second search signal is complementary to the first search signal. The storage unit has a first inverter and a second inverter. The first inverter has a first latch node coupled to a second end of the first switch. The second inverter is cross-coupled to the first inverter and has a second latch node coupled to a second end of the second switch.

12 Claims, 2 Drawing Sheets

CONTENT-ADDRESSABLE MEMORY HAVING SIX-TRANSISTOR CONTENT-ADDRESSABLE MEMORY CELLS

BACKGROUND OF THE INVENTION

1. Field of the Invention

The present invention is related to a content-addressable memory (CAM) and a memory cell thereof. More particularly, the present invention relates to a CAM and a six-transistor (6-T) memory cell thereof.

2. Description of the Prior Art

Content-addressable memory (CAM) is a special type of computer memory used in certain very-high-speed searching applications. It is also known as associative memory or associative storage and compares input search data against a table of stored data, and returns the address of matched data. Kostas Pagiamtzis and Ali Sheikholeslami published a paper entitled "Content-Addressable Memory (CAM) Circuits and Architectures: A Tutorial and Survey" on IEEE JOURNAL OF SOLID-STATE CIRCUITS, VOL. 41, NO. 3, MARCH 2006. This paper discloses a ten-transistor (10-T) NOR-type CAM cell and a nine-transistor (9-T) NAND-type CAM cell. However, the total number of a single CAM cell is still too much.

SUMMARY OF THE INVENTION

One embodiment of the present invention discloses a content-addressable memory (CAM) cell. The CAM cell comprises a first switch, a second switch and a storage unit. The first switch comprises a first end coupled to a matchline, a second end, and a control end for controlling electrical connection between the first end and the second end according to a first search signal. The second switch comprises a first end coupled to the matchline, a second end, and a control end for controlling electrical connection between the first end of the second switch and the second end of the second switch according to a second search signal. The second search signal is complementary to the first search signal. The storage unit is configured to store a bit and comprises a first inverter and a second inverter. The first inverter has a first latch node coupled to the second end of the first switch. The second inverter is cross-coupled to the first inverter and has a second latch node coupled to the second end of the second switch.

Another embodiment of the present invention discloses content-addressable memory (CAM). The CAM comprises a plurality of first searchlines, a plurality of second searchlines, a plurality of matchlines, and a plurality of CAM cells. Each of the CAM cells comprises a first switch, a second switch and a storage unit. The first switch comprises a first end coupled to a corresponding matchline, a second end, and a control end for controlling electrical connection between the first end and the second end according to a first search signal received from a corresponding first searchline. The second switch comprises a first end coupled to the corresponding matchline, a second end, and a control end for controlling electrical connection between the first end of the second switch and the second end of the second switch according to a second search signal received from a corresponding second searchline. The second search signal is complementary to the first search signal. The storage unit is configured to store a bit and comprises a first inverter and a second inverter. The first inverter has a first latch node coupled to the second end of the first switch. The second inverter is cross-coupled to the first inverter and has a second latch node coupled to the second end of the second switch.

These and other objectives of the present invention will no doubt become obvious to those of ordinary skill in the art after reading the following detailed description of the preferred embodiment that is illustrated in the various figures and drawings.

DETAILED DESCRIPTION

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
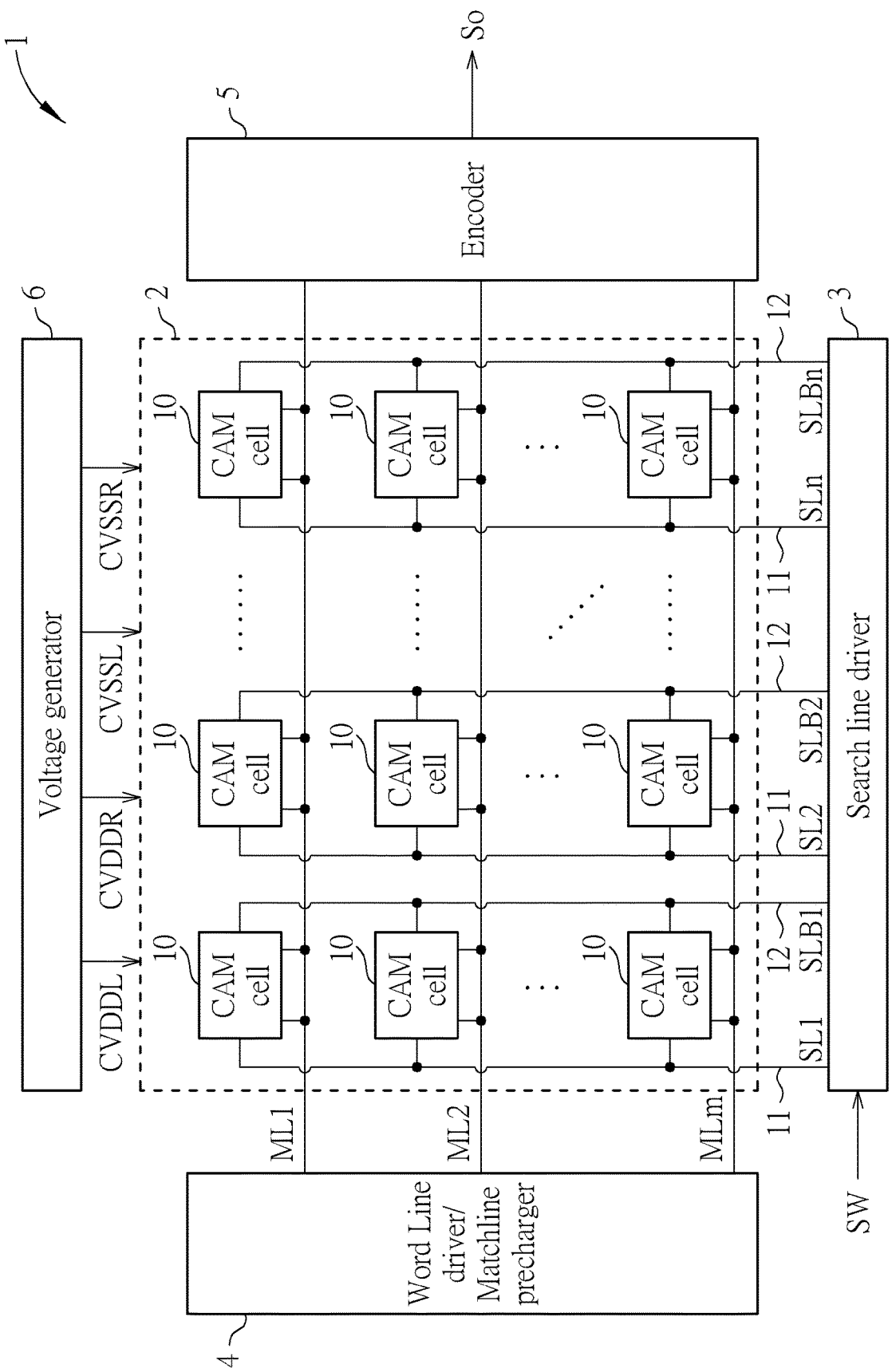
FIG. 1 is a functional diagram of a content-addressable memory (CAM) according to an embodiment of the present invention.

Please refer to FIG. 1. FIG. 1 is a functional diagram of a content-addressable memory (CAM) 1 according to an embodiment of the present invention. The CAM 1 comprises a CAM cell array 2, a search line driver 3, a word line driver/matchline precharger 4, a plurality of first searchlines 11, a plurality of second searchlines 12, and a plurality of matchlines ML1 to MLm. The CAM cell array 2 comprises a plurality of CAM cells 10 arranged in a matrix having m rows and n columns. The parameters m and n are positive integers greater than 1. Each of the CAM cells 10 is used to store a single bit, and coupled to a corresponding matchline, a corresponding first search line 11 and a corresponding second search line 12. The voltages of the first search line 11 and the second search line 12 coupled to the same CAM cell 10 are complementary to each other. For example, a first search signal SL1 and a second search signal SLB1 are applied to the CAM cells 10 on the same column, and the first search signal SL1 and the second search signal SLB1 are complementary to each other. In other words, the first search signal SL1 and the second search signal SLB1 are differential signals. Similarly, a first search signal SL2 and the second search signal SLB2 are complementary to each other, and a first search signal SLn and the second search signal SLBn are complementary to each other. In addition, the CAM cells 10 on the same row are used to store a word. When looking for a specific word stored in a row of the CAM cell array 2, the word line driver/matchline precharger 4 precharges all matchlines ML1-MLm to a high voltage, leaving them all temporarily in the match state. Next, a search word SW is inputted to the search line driver 3, and the search line driver 3 broadcasts the search word SW onto the differential searchlines 11 and 12 to the CAM cell array 2. Each CAM cell 10 compares its stored bit with the bit on its corresponding searchlines 11 and 12. Matchlines, on which all bits match, remain in the match state. Matchlines that have at least one bit mismatches are discharged to ground. The decoder 5 then detects which of the matchlines ML1-MLm remains in the match state. Finally, the encoder 5 maps the matchline remaining in the match sate to a corresponding address So and outputs the address So.

Figure 2:
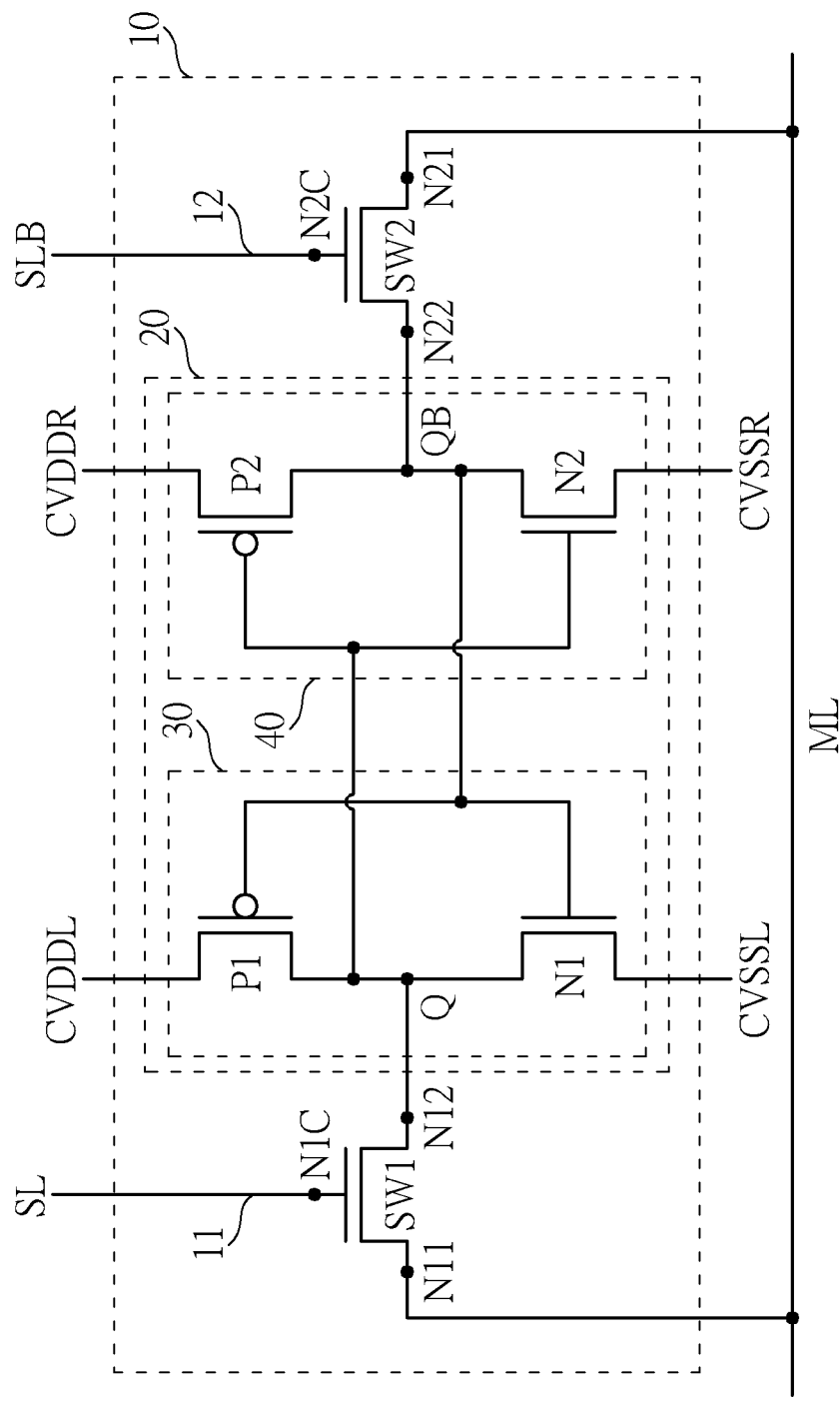
FIG. 2 is a circuit diagram of a CAM cell of the CAM shown in FIG. 1.

Please refer to FIG. 2. FIG. 2 is a circuit diagram of a CAM cell 10 of the CAM 1 shown in FIG. 1. The CAM cell 10 comprises a first switch SW1, a second switch SW2 and a storage unit 20. The first switch SW1 comprises a first end N11 coupled to a matchline ML, a second end N12, and a control end N1C for controlling electrical connection between the first end N11 and the second end N12 according to a first search signal SL. The second switch SW2 comprises a first end N21 coupled to the matchline ML, a second end N22, and a control end N2C for controlling electrical connection between the first end N21 of the second switch SW2 and the second end N22 of the second switch SW2 according to a second search signal SLB. The second search signal SLB is complementary to the first search signal SL. Accordingly, when the first switch SW1 is turned on to electrically connect the first end N11 of the first switch SW1 to the second end N12 of the first switch SW1, the second switch SW2 is turned off to electrically disconnect the first end N21 of the second switch SW2 from the second end N22 of the second switch SW2. Moreover, when the first switch SW1 is turned off to electrically disconnect the first end N11 of the first switch SW1 from the second end N12 of the first switch SW1, the second switch SW2 is turned on to electrically connect the first end N21 of the second switch SW2 to the second end N22 of the second switch SW2.

In an embodiment of the present invention, the first switch SW1 and the second switch SW2 may be two N-type metal-oxide-semiconductor (NMOS) transistors. However, the present invention is not limited thereto. The control end N1C is a gate of the NMOS transistor SW1, and the first end N11 and the second end N12 are a source and a drain of the NMOS transistor SW1. The control end N2C is a gate of the NMOS transistor SW2, and the first end N21 and the second end N22 are a source and a drain of the NMOS transistor SW2.

The storage unit 20 is configured to store a bit and comprises a first inverter 30 and a second inverter 40 cross-coupled to the first inverter 30. The first inverter 30 has a first latch node Q coupled to the second end N12 of the first switch SW1, and the second inverter 40 has a second latch node QB coupled to the second end N22 of the second switch SW2. Since the first inverter 30 and the second inverter 40 are cross-coupled, the voltage level of the first latch node B is complementary to the voltage level of the second latch node QB.

In addition, when the CAM cell 10 operates, a first power voltage CVDDL and a third power voltage CVSSL are applied to the first inverter 30 to provide electric power to the first inverter 30, and a second power voltage CVDDR and a fourth power voltage CVSSR are applied to the second inverter 40 to provide electric power to the second inverter 40. The first power voltage CVDDL may be equal to the second power voltage CVDDR, the third power voltage CVSSL may be equal to the fourth power voltage CVSSR, and the third power voltage CVSSL and the fourth power voltage CVSSR may be less than the first power voltage CVDDL and the second power voltage CVDDR.

When a bit is written into the CAM cell 10, the matchline ML is used as a word line, and the first search line 11 and the second search line 12 are used as two bit lines. In detail, when a bit of logic 1 is written into the CAM cell 10, the word line driver/matchline precharger 4 applies a high voltage to the matchline ML, and the search line driver 3 applies a high voltage to the first search line 11 (i.e., the first search signal SL is high) and a low voltage to the second search line 12 (i.e., the second search signal SLB is low). Accordingly, the first switch SW1 is turned on, and the second switch SW2 is turned off. As a result, a voltage level of the first latch node Q is high. Since the first inverter 30 and the second inverter 40 are cross-coupled, a voltage level of the second latch node QB would be low, and the bit of logic 1 would be stored in the storage unit 20 of the CAM cell 10. Similarly, when a bit of logic 0 is written into the CAM cell 10, the word line driver/matchline precharger 4 applies a high voltage to the matchline ML, and the search line driver 3 applies a low voltage to the first search line 11 (i.e., the first search signal SL is low) and a high voltage to the second search line 12 (i.e., the second search signal SLB is high). Accordingly, the first switch SW1 is turned off, and the second switch SW2 is turned on. As a result, the voltage level of the second latch node QB is high. Since the first inverter 30 and the second inverter 40 are cross-coupled, the voltage level of the first latch node Q would be low, and the bit of logic 0 would be stored in the storage unit 20 of the CAM cell 10.

In an embodiment of the present invention, when a bit of logic 1 is written into the CAM cell 10, in order to accelerate transition of the voltage level of second latch node QB, the second power voltage CVDDR may be greater than the first power voltage CVDDL, and/or the fourth power voltage CVSSR may be less than the third power voltage CVSSL. Similarly, when a bit of logic 0 is written into the CAM cell 10, in order to accelerate transition of the voltage level of first latch node Q, the first power voltage CVDDL may be greater than the second power voltage CVDDR, and/or the third power voltage CVSSL may be less than the fourth power voltage CVSSR.

When determining if the bit stored in the CAM cell 10 is logic 1, the word line driver/matchline precharger 4 precharges the matchline ML to a high voltage, leaving the matchline ML temporarily in the match state. The first search signal SL is high and applied to the first search line 11, and the second search signal SLB is low and applied to the second search line 12. Accordingly, the first switch SW1 is turned on, and the second switch SW2 is turned off. If the bit stored in the CAM 10 is logic 1, the voltage level of first latch node Q is high, and the voltage level of second latch node QB is low. As a result, the voltage level of the matchline ML is kept at a high level such that the matchline ML remains in the match state. Conversely, if the bit stored in the CAM 10 is logic 0, the voltage level of first latch node Q is low, and the voltage level of second latch node QB is high. As a result, the voltage level of the matchline ML would be pulled down such that the matchline ML would change to a mismatch state.

Similarly, when determining if the bit stored in the CAM cell 10 is logic 0, the word line driver/matchline precharger 4 precharges the matchline ML to a high voltage, leaving the matchline ML temporarily in the match state. The first search signal SL is low and applied to the first search line 11, and the second search signal SLB is high and applied to the second search line 12. Accordingly, the first switch SW1 is turned off, and the second switch SW2 is turned on. If the bit stored in the CAM 10 is logic 0, the voltage level of first latch node Q is low, and the voltage level of second latch node QB is high. As a result, the voltage level of the matchline ML is kept at a high level such that the matchline ML remains in the match state. Conversely, if the bit stored in the CAM 10 is logic 1, the voltage level of first latch node Q is high, and the voltage level of second latch node QB is low. As a result, the voltage level of the matchline ML would be pulled down such that the matchline ML would change to the mismatch state. In other words, the final voltage level of the matchline ML could be regarded as a search result outputted from the CAM cell 10, and the search result is determined according to the bit stored in the CAM cell 10, the first search signal SL and the second search signal SLB.

As shown in FIG. 2, the first inverter 30 may comprise a first P-type metal-oxide-semiconductor (PMOS) transistor P1 and a first N-type metal-oxide-semiconductor (NMOS) transistor N1. A source of the first PMOS P1 is coupled to the first power voltage CVDDL, a gate of the first PMOS P1 is coupled to the second latch node QB, and a drain of the first PMOS P1 is coupled to the first latch node Q. A source of the first NMOS N1 is coupled to the third power voltage CVSSL, a gate of the first NMOS N1 is coupled to the second latch node QB, and a drain of the first NMOS N1 is coupled to the first latch node Q. A source of the second PMOS P2 is coupled to the second power voltage CVDDR, a gate of the second PMOS P2 is coupled to the first latch node Q, and a drain of the second PMOS P2 is coupled to the second latch node QB. A source of the second NMOS N2 is coupled to the fourth power voltage CVSSR, a gate of the second NMOS N2 is coupled to the first latch node Q, and a drain of the second NMOS N2 is coupled to the second latch node QB. Since the CAM cell 10 comprises the four NMOS transistors SW1, SW2, N1 and N2 and the two PMOS transistors P1 and P2, the CAM cell 10 is a six-transistor (6-T) CAM memory cell. As compared to 10-T and 9-T CAM memory cells of the prior art, the 6-T CAM cell 10 has a simple circuit structure with less transistors. Therefore, the cost and power consumption of the CAM cell 10 are less than those of the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A content-addressable memory (CAM) cell, comprising:
  a first switch, comprising:
    a first end coupled to a matchline;
    a second end; and
    a control end for controlling electrical connection between the first end and the second end according to a first search signal;
  a second switch, comprising:
    a first end coupled to the matchline;
    a second end; and
    a control end for controlling electrical connection between the first end of the second switch and the second end of the second switch according to a second search signal, wherein the second search signal is complementary to the first search signal; and
  a storage unit, for storing a bit, and comprising:
    a first inverter, coupled to and powered by a first power voltage and a third power voltage less than the first power voltage, and having a first latch node coupled to the second end of the first switch; and
    a second inverter, cross-coupled to the first inverter, coupled to and powered by a second power voltage and a fourth power voltage less than the second power voltage, and having a second latch node coupled to the second end of the second switch;
  wherein when the first switch is turned on and the second switch is turned off to write a first logic value into the storage unit and to drive a first voltage level of the second end of the first switch and the first latch node to be greater than a second voltage level of the second end of the second switch and the second latch node, the second power voltage is greater than the first power voltage, and/or the fourth power voltage is less than the third power voltage; and
  wherein when the first switch is turned off and the second switch is turned on to write a second logic value into the storage unit and to drive the first voltage level to be less than the second voltage level, the first power voltage is greater than the second power voltage, and/or the third power voltage is less than the fourth power voltage.

2. The CAM cell of claim 1, wherein the CAM cell outputs a search result via the matchline according to the bit, the first search signal and the second search signal.

3. The CAM cell of claim 1, wherein the first voltage level is complementary to the second voltage level, and the first voltage level and the second voltage level are associated with the bit stored in the storage unit.

4. The CAM cell of claim 1, wherein the first inverter comprises:
  a first P-type metal-oxide-semiconductor (PMOS) transistor, a source of the first PMOS being coupled to the first power voltage, a gate of the first PMOS being coupled to the second latch node, and a drain of the first PMOS being coupled to the first latch node; and
  a first N-type metal-oxide-semiconductor (NMOS) transistor, a source of the first NMOS being coupled to the third power voltage, a gate of the first NMOS being coupled to the second latch node, and a drain of the first NMOS being coupled to the first latch node; and
  wherein the second inverter comprises:
  a second PMOS transistor, a source of the second PMOS being coupled to the second power voltage, a gate of the second PMOS being coupled to the first latch node, and a drain of the second PMOS being coupled to the second latch node; and
  a second NMOS transistor, a source of the second NMOS being coupled to the fourth power voltage, a gate of the second NMOS being coupled to the first latch node, and a drain of the second NMOS being coupled to the second latch node.

5. The CAM cell of claim 1, wherein the first end of the first switch is electrically connected to the second end of the first switch when the first end of the second switch is electrically disconnected from the second end of the second switch; and
  wherein the first end of the first switch is electrically disconnected from the second end of the first switch when the first end of the second switch is electrically connected to the second end of the second switch.

6. The CAM cell of claim 1, wherein the first switch is a third NMOS transistor, the control end of the first switch is a gate of the third NMOS transistor, and the first end and the second end of the first switch are a source and a drain of the third NMOS transistor respectively; and
  wherein the second switch is a fourth NMOS transistor, the control end of the second switch is a gate of the fourth NMOS transistor, and the first end and the second end of the second switch are a source and a drain of the fourth NMOS transistor respectively.

7. A content-addressable memory (CAM), comprising:
  a plurality of first searchlines;
  a plurality of second searchlines;
  a plurality of matchlines; and a plurality of CAM cells, each of the CAM cells comprising:
- a first switch, comprising:
  - a first end coupled to a corresponding matchline;
  - a second end; and
  - a control end for controlling electrical connection between the first end and the second end according to a first search signal received from a corresponding first searchline;
- a second switch, comprising:
  - a first end coupled to the corresponding matchline;
  - a second end; and
  - a control end for controlling electrical connection between the first end of the second switch and the second end of the second switch according to a second search signal received from a corresponding second searchline, wherein the second search signal is complementary to the first search signal; and
- a storage unit, for storing a bit, and comprising
  - a first inverter, coupled to and powered by a first power voltage and a third power voltage less than the first power voltage, and having a first latch node coupled to the second end of the first switch; and
  - a second inverter, cross-coupled to the first inverter, coupled to and powered by a second power voltage and a fourth power voltage less than the second power voltage, and having a second latch node coupled to the second end of the second switch;
wherein when the first switch is turned on and the second switch is turned off to write a first logic value into the storage unit and to drive a first voltage level of the second end of the first switch and the first latch node to be greater than a second voltage level of the second end of the second switch and the second latch node, the second power voltage is greater than the first power voltage, and/or the fourth power voltage is less than the third power voltage; and
wherein when the first switch is turned off and the second switch is turned on to write a second logic value into the storage unit and to drive the first voltage level to be less than the second voltage level, the first power voltage is greater than the second power voltage, and/or the third power voltage is less than the fourth power voltage.

8. The content-addressable memory of claim 7, wherein the each of the CAM cells outputs a search result via the corresponding matchline according to the bit, the first search signal and the second search signal.

9. The content-addressable memory of claim 7, wherein the first voltage level is complementary to the second voltage level, and the first voltage level and the second voltage level are associated with the bit stored in the storage unit.

10. The content-addressable memory of claim 7, wherein the first inverter comprises:
- a first P-type metal-oxide-semiconductor (PMOS) transistor, a source of the first PMOS being coupled to the first power voltage, a gate of the first PMOS being coupled to the second latch node, and a drain of the first PMOS being coupled to the first latch node; and
- a first N-type metal-oxide-semiconductor (NMOS) transistor, a source of the first NMOS being coupled to the third power voltage, a gate of the first NMOS being coupled to the second latch node, and a drain of the first NMOS being coupled to the first latch node; and wherein the second inverter comprises:
- a second PMOS transistor, a source of the second PMOS being coupled to the second power voltage, a gate of the second PMOS being coupled to the first latch node, and a drain of the second PMOS being coupled to the second latch node; and
- a second NMOS transistor, a source of the second NMOS being coupled to the fourth power voltage, a gate of the second NMOS being coupled to the first latch node, and a drain of the second NMOS being coupled to the second latch node.

11. The content-addressable memory of claim 7, wherein the first end of the first switch is electrically connected to the second end of the first switch when the first end of the second switch is electrically disconnected from the second end of the second switch; and
- wherein the first end of the first switch is electrically disconnected from the second end of the first switch when the first end of the second switch is electrically connected to the second end of the second switch.

12. The content-addressable memory of claim 7, wherein the first switch is a third NMOS transistor, the control end of the first switch is a gate of the third NMOS transistor, and the first end and the second end of the first switch are a source and a drain of the third NMOS transistor respectively; and
- wherein the second switch is a fourth NMOS transistor, the control end of the second switch is a gate of the fourth NMOS transistor, and the first end and the second end of the second switch are a source and a drain of the fourth NMOS transistor respectively.

* * * * *